(12) United States Patent
Timperio et al.

(10) Patent No.: US 6,564,811 B2
(45) Date of Patent: May 20, 2003

(54) METHOD OF REDUCING RESIDUE DEPOSITION ONTO ASH CHAMBER BASE SURFACES

(75) Inventors: Onofio L. Timperio, Rio Rancho, NM (US); Stephen J. Luca, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 80 days.

(21) Appl. No.: 09/818,177

(22) Filed: Mar. 26, 2001

(65) Prior Publication Data

US 2002/0137354 A1 Sep. 26, 2002

(51) Int. Cl.⁷ .............................. B08B 6/00; C23C 16/00
(52) U.S. Cl. .............................. 134/1.2; 134/19; 134/35; 438/725
(58) Field of Search .............................. 134/1.2, 19, 35; 438/715, 725; 216/67

(56) References Cited

U.S. PATENT DOCUMENTS

| | | | | |
|---|---|---|---|---|
| 5,707,487 A | * | 1/1998 | Hori et al. | 438/703 |
| 5,770,099 A | * | 6/1998 | Rice et al. | 216/67 |
| 5,926,743 A | * | 7/1999 | Xi et al. | 134/1.1 |
| 5,958,510 A | * | 9/1999 | Sivaramakrishnam et al. | 118/719 |
| 6,231,776 B1 | * | 5/2001 | Flamm | 204/192.32 |

* cited by examiner

Primary Examiner—Randy Gulakowski
Assistant Examiner—Saeed Chaudhry
(74) Attorney, Agent, or Firm—Mark V. Seeley

(57) ABSTRACT

A semiconductor manufacturing a method and an apparatus is described. That apparatus includes an ash chamber that has an ash chamber base, and a heating unit that is coupled to the ash chamber base. The heating unit applies heat to the ash chamber base to reduce deposition of residues onto ash chamber base surfaces, which could cause surface particle defects in a semiconductor device.

5 Claims, 2 Drawing Sheets

METHOD OF REDUCING RESIDUE DEPOSITION ONTO ASH CHAMBER BASE SURFACES

FIELD OF THE INVENTION

The present invention relates to semiconductor manufacturing apparatus, in particular equipment that includes an ash chamber for ashing photoresist, when making semiconductor devices.

BACKGROUND OF THE INVENTION

To make a semiconductor device, several layers of different types of material are deposited on a substrate, e.g., a silicon wafer. Some are metal layers that must be etched to create devices and interconnects that form the desired integrated circuits. A photolithography process is used to define the sections of the metal layers that must be removed. That process may include the following steps: depositing a layer of photoresist, masking portions of it, exposing the masked layer to light that has a selected wavelength, then developing the unexposed portions. This process leaves hardened photoresist over the sections of the metal layer that are not to be removed and exposes sections of the metal layer that are to be etched.

After those exposed portions are etched, the remaining photoresist must be removed. An ashing step is generally used to remove the photoresist. That step may require placing the wafer in an ash chamber, then exposing it to a plasma, which reacts with the photoresist (in effect, burns it up), removing it from the wafer surface.

To facilitate photoresist removal, the susceptor (upon which the wafer is mounted) may be heated. To ensure that this practice does not crack or break the quartz bell jar that is positioned within the ash chamber base (hereinafter "ash base"), a coolant (e.g., water drawn from a municipal water supply) is typically circulated through the ash base. Circulating coolant through the ash base cools the ash base surfaces. Polymer residues (which comprise byproducts of the plasma generation process) may form on those cooled surfaces. Those residues can flake off the ash base walls and drop onto the wafer. This can generate surface particle defects that can ruin one or more of the semiconductor devices that are being formed on the wafer. In some cases, such particles can cause an interlayer dielectric ("ILD"), which is deposited over the etched metal layer, to tear as it is being polished. Such ILD tear outs can damage multiple die that are positioned adjacent to the one upon which the particle is lodged. As the critical dimensions for integrated circuit devices continue to shrink, even very small particles can cause fatal defects.

Accordingly, there is a need for an improved semiconductor manufacturing apparatus that reduces the number of semiconductor device defects that result from the photoresist ashing process. There is a need for such an apparatus that reduces residue deposition on ash base surfaces, thereby decreasing surface defects. The present invention provides such an apparatus.

DETAILED DESCRIPTION OF THE PRESENT INVENTION

The present invention relates to an improved semiconductor manufacturing apparatus. That device includes an ash chamber that has an ash chamber base, and a heating unit. The heating unit is coupled to the ash chamber base to apply heat to the ash chamber base to reduce deposition of residues onto ash chamber base surfaces, which could cause surface particle defects in a semiconductor device. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1:
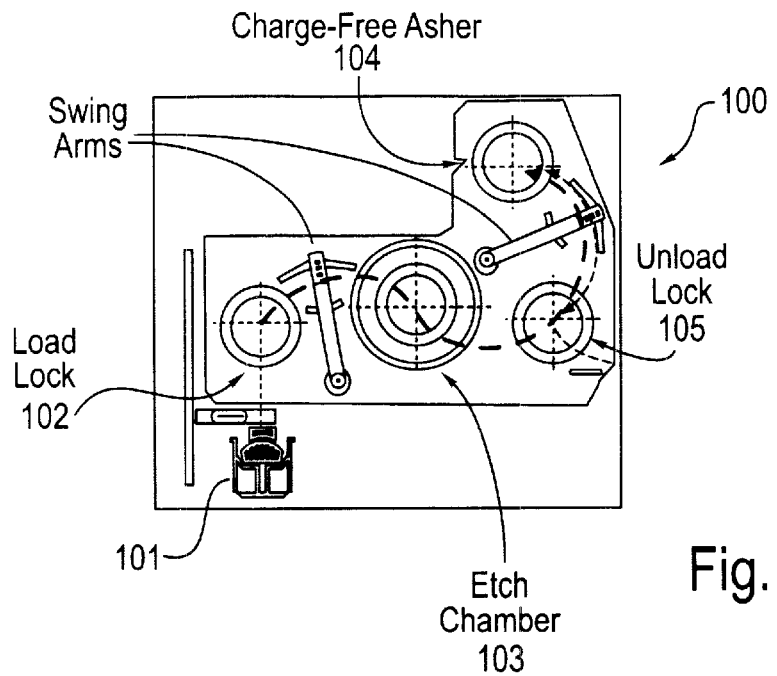
FIG. 1 represents a top view of a cross section of a plasma etcher that may benefit from the present invention.

FIG. 1 represents a top view of a cross section of a plasma etcher 100 that may benefit from the present invention. Etcher 100 includes load cassette 101 for loading a wafer into load lock 102. From load lock 102, the wafer is transferred to etch chamber 103. After an etching operation is performed, the wafer is transferred to ash chamber 104, where the ashing operation is carried out, then to unload lock 105, from which the wafer is removed from etcher 100.

Figure 2:
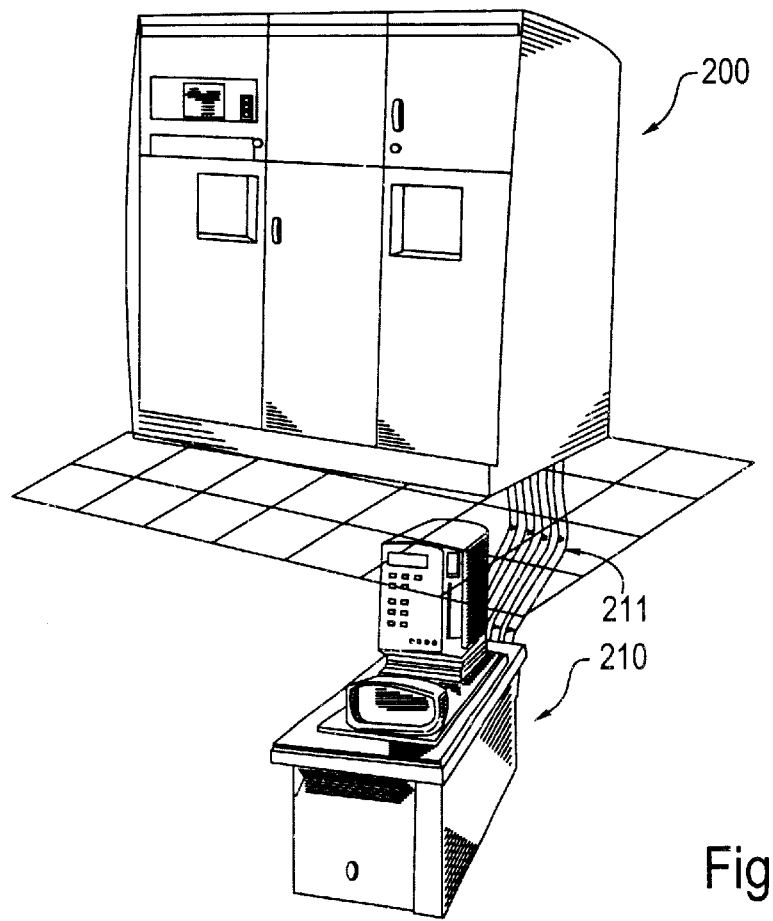
FIG. 2 represents a perspective view of an embodiment of the semiconductor manufacturing apparatus of the present invention in which a plasma etcher is coupled to a temperature control recirculating unit.

Current practice, which includes circulating relatively cool water through the ash base, causes polymer residues to build up on the ash base walls, as wafers are processed. Those residues may fall from those walls onto a wafer's surface, generating surface defects in one or more die. The present invention reduces those defects by reducing residue deposition on the ash base walls. An example of equipment that can serve to decrease residue build up is illustrated in FIG. 2. Here, plasma etcher 200 is coupled to heating unit 210. That plasma etcher includes an etch chamber and an ash chamber—as shown in FIG. 1, and may be one of many commercially available plasma etchers, such as the M300, M500, M600, and M700 series plasma etchers that are available from Hitachi America, Ltd. Heating unit 210 may be a commercially available temperature control recirculating unit, e.g., the Julabo® MD-4 or HE-4 heating circulator, which is available from Julabo USA. That particular unit includes a heating element that can heat a fluid, e.g., water, to a temperature that is between about 20° C. and about 200° C., while keeping the temperature stable to within ±0.01° C.

As shown, heating unit 210 is coupled to the ash base of plasma etcher 200 via conduits, e.g., tubes, 211. Those skilled in the art will recognize that one end of tubes 211 can be hooked up to the ports, which are located on the ash base, that currently are used to receive water to cool the ash base. The other end of those tubes can be hooked up to ports that are located on the heating unit. In this embodiment, heating unit 210 is located underneath a floor grating upon which etcher 200 is placed. Tubes 211 pass through the grating to couple the etcher with the heating unit.

When the apparatus shown in FIG. 2 is put in use, a fluid is circulated from heating unit 210 to the ash base. Heating unit 210 heats that fluid to a sufficient temperature to ensure reduction of residue deposition on ash base surfaces (both on the bell jar and other exposed portions of the ash base) that could otherwise cause surface particle defects. The fluid may be water, which is maintained at a temperature that is at least about 50° C., and preferably between about 50° C. and about 70° C. More preferably, the water temperature is maintained at about 60° C. It may be desirable to limit temperature variation from the set temperature to ±1° C. or even ±0.1° C. In addition, when selecting 60° C. for the water temperature, an upper alarm set point of about 62° C. and a lower alarm set point of about 55° C. may be desired. To protect against any damage that may result from excess temperature of the circulating water, the apparatus can be programmed to shut down when it reaches a set temperature, e.g., a selected temperature that lies between about 65° C. and about 70° C. The apparatus may be shut down periodically for preventive maintenance, e.g., after about 1,500 wafers have been processed through it.

Figure 3:
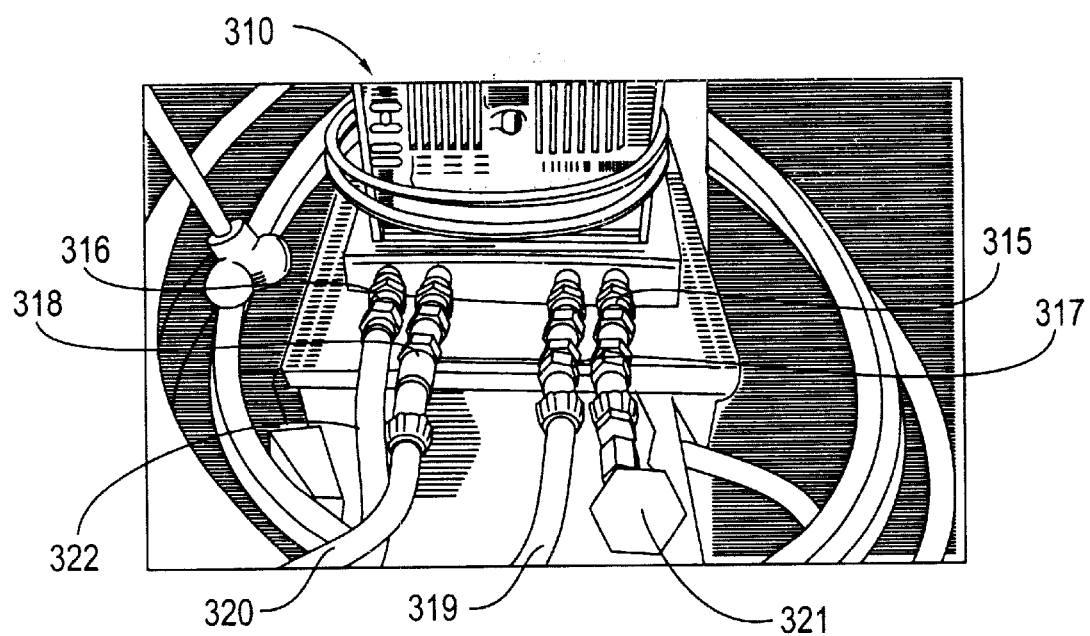
FIG. 3 represents a rear view of the temperature control recirculating unit of FIG. 2.

FIG. 3 provides a rear view of the temperature control recirculating unit of FIG. 2. Heated water is delivered from unit 310 to the ash base through tube 319 via connector 317. Heated water is returned to unit 310 from the ash base through tube 320 via connector 318. To accommodate varying tube diameters, adapters may be attached to connectors 317, 318 that connect to tubes 319, 320 at one end and to connectors 317, 318 at the other end.

In operation, water sent to the ash base may return at a higher temperature. To cool that returned water, cooling water (e.g., water taken from a municipal water supply) can be delivered to unit 310 through tube 321 via connector 315. That cooling water circulates through the unit, then is dumped out tube 322 via connector 316.

The semiconductor manufacturing apparatus of the present invention reduces surface particle defects (e.g., those which may cause ILD tear outs) by heating the ash chamber base. As a result, die yield may increase. Features shown in the above figures are not intended to be drawn to scale, nor are they intended to be shown in precise positional relationship. Additional components that may be used to make the semiconductor manufacturing apparatus of the present invention have been omitted when not useful to describe aspects of the present invention. Although the foregoing description has specified certain features that may be included in such an apparatus, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of reducing residues that are deposited onto ash chamber base surfaces when removing photoresist from the surface of a wafer comprising:

circulating a fluid from a heating unit to the ash chamber base; and heating the fluid up to a sufficient temperature to reduce residue deposition onto the ash chamber base surface wherein the fluid is water and the water is maintained at a selected temperature between about 50° C. and about 70° C.

2. The method of claim 1 wherein the fluid temperature is maintained within about 1° C. of the selected temperature.

3. The method of claim 2 further comprising circulating a second fluid through the heating unit to cool the water as it is returned from the ash chamber base.

4. The method of claim 3 wherein the residues comprise byproducts of a plasma that is generated to remove photoresist from the surface of a wafer that contains partially made semiconductor devices.

5. A method of removing residues that were deposited onto ash chamber base surfaces when removing photoresist from the surface of a wafer comprising:

circulating a fluid from a heating unit to the ash chamber base; and heating the fluid up to a sufficient temperature to remove the residues from the ash chamber base surface wherein the fluid is water and the water is maintained at a selected temperature between about 50° C. and about 70° C.

* * * * *